United States Patent
Prinz et al.

(10) Patent No.: US 6,552,554 B1
(45) Date of Patent: Apr. 22, 2003

(54) TESTING CURRENT PERPENDICULAR TO PLANE GIANT MAGNETORESISTANCE MULTILAYER DEVICES

(75) Inventors: Gary A. Prinz, Alexandria, VA (US); Konrad Bussmann, Springfield, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/004,448

(22) Filed: Dec. 6, 2001

(51) Int. Cl.$^7$ .................. G01R 31/26; G01R 31/02; G01R 27/04; H01L 21/425; H01L 21/00
(52) U.S. Cl. .................. 324/719; 324/758; 324/632; 324/765; 324/752; 436/526; 436/37; 436/147
(58) Field of Search .................. 324/719, 758, 324/632, 765, 752; 438/3; 365/171, 173, 158; 436/526, 37, 147

(56) References Cited

U.S. PATENT DOCUMENTS

| | | | | |
|---|---|---|---|---|
| 4,703,252 A | | 10/1987 | Perloff et al. ................ 324/758 |
| 4,857,839 A | | 8/1989 | Look et al. .................. 324/752 |
| 5,150,042 A | | 9/1992 | Look et al. .................. 324/765 |
| 5,239,269 A | | 8/1993 | Martens et al. ............. 324/632 |
| 5,541,868 A | * | 7/1996 | Prinz ........................... 365/98 |
| 5,661,062 A | | 8/1997 | Prinz ........................... 438/3 |
| 5,723,981 A | | 3/1998 | Hellemans et al. ......... 324/719 |
| 5,968,679 A | * | 10/1999 | Kobayashi et al. ......... 428/694 |
| 6,091,248 A | | 7/2000 | Hellemans et al. ......... 324/719 |
| 6,111,782 A | * | 8/2000 | Sakakima et al. .......... 365/158 |
| 6,111,784 A | | 8/2000 | Nishimura ................... 365/173 |
| 6,171,693 B1 | | 1/2001 | Lubitz et al. ............... 428/332 |
| 6,201,401 B1 | | 3/2001 | Hellemans et al. ......... 324/719 |
| 6,205,008 B1 | * | 3/2001 | Gijs et al. ................... 360/324 |
| 6,256,222 B1 | * | 7/2001 | Sakakima et al. .......... 365/158 |
| 6,351,410 B1 | * | 2/2002 | Nakao et al. ................ 365/171 |
| 6,381,170 B1 | * | 4/2002 | Prinz .......................... 365/171 |
| 6,404,674 B1 | * | 6/2002 | Anthony et al. ............ 365/173 |
| 6,455,177 B1 | * | 9/2002 | Everitt et al. ............... 428/693 |
| 6,468,809 B1 | * | 10/2002 | Prinz et al. ................. 436/526 |
| 6,487,110 B2 | * | 11/2002 | Nishimura et al. ......... 365/158 |

* cited by examiner

*Primary Examiner*—N. Le
*Assistant Examiner*—Wasseem H. Hamdan
(74) *Attorney, Agent, or Firm*—John J. Karasek; Stephen T. Hunnius

(57) ABSTRACT

A wafer suitable to be tested for current-perpendicular to the plane resistance includes a substrate, a conductive base layer on the substrate, a magnetic multilayer on the conductive base layer, and a top conductive layer. A testing ring is formed on the magnetic multilayer in a manner whereby it is separated from rest of the magnetic multilayer by a trench in the magnetic multilayer. Within the testing ring, the magnetic multilayer includes a hole. The current perpendicular to the plane resistance of the wafer may be determined by passing a predetermined current perpendicular through the testing ring by contacting a probe to the testing ring and measuring the voltage at the conductive base layer. The probe used in the present invention may be an AFM or a STM probe.

20 Claims, 4 Drawing Sheets

TESTING CURRENT PERPENDICULAR TO PLANE GIANT MAGNETORESISTANCE MULTILAYER DEVICES

BACKGROUND OF THE INVENTION

1. Field of the Invention

The present invention relates generally to a giant magnetoresistance (GMR) multilayer device and methods for testing the properties of current perpendicular to the plane GMR multilayers.

2. Description of the Prior Art

Current perpendicular to plane (CPP)-GMR devices have potential use as random access memories for computers. This type of memory has the advantage of high reliability, nonvolatility in the event of power loss and an infinite useful lifetime. This system operates on the basis of the giant magnetoresistance phenomena, which results from the current passing through a magnetic multilayer material, whose magnetic layers are either aligned or anti-aligned, with a resulting change in resistance between the two states.

Much effort has been made to produce this type of GMR devices. For example, Prinz discloses in U.S. Pat. No. 5,477,482 a method of producing ultrahigh density nonvolatile ferromagnetic random access memories using GMR metal multilayers deposited upon semiconductor wafers. However, it has been difficult to control the quality of such wafers during their production for lack of a simple testing method. Typically, in order to test a CPP-GMR wafer, CPP resistance of the CPP-GMR wafer must be measured. GMR multilayer devices inherently have a very low electrical resistance. This is because the electrical current is propagated vertically through a metallic multilayer stack whose path length is short and cross-section is very large.

A GMR multilayer wafer typically consists of ten to twenty layers, each layer being a few nanometers thick, for a total path length of around 1000 Å. Therefore, even at sub-micron area dimensions, the total resistance for this wafer may be only 1 ohm or less. If the quality of the deposited multilayer film is to be tested before actually patterning it into a finished device, attempting to measure the perpendicular resistance to determine whether the unpatterned wafer is within specifications would not be possible with any currently available techniques. That is because, for example, a six-inch diameter wafer would have a perpendicular resistance of $10^{-9}$ ohm, which is too small a resistance to be measured using currently available measurement devices.

Unfortunately, carrying out a full processing or patterning sequence in order to determine if the unpatterned original multilayer wafer is acceptable, is not cost effective. Furthermore, if it were desirable to carry out a material optimization study on an unfinished wafer by varying the thickness or composition of the multilayer, a technique that can measure the performance of a GMR device performance without investing in the full processing of each layer would be preferred.

In addition, it should be noted that attempting to determine the performance of a GMR multilayer device from a simple current in plane (CIP) measurement is not practical for several reasons. First, it is not clear whether an optimum CPP material is also an optimum CIP material. Typically, a device using a CPP material may require a very smooth interface, whereas a device using CIP material may require a rough interface. Secondly, a device using a CPP material requires a very thick top and bottom layer of a good conductor, which will short out a CIP measurement of in the CPP material. Lastly, a meaningful GMR measurement in the multilayer of a GMR device requires that the device can be placed in a well-defined anti-aligned state for comparison with a totally aligned state. This is difficult to guarantee in a fully unpatterned GMR wafer without deliberately constructing the nonmagnetic space layer to have a thickness, which guarantees anti-ferromagnetic coupling. As a result, conventional CIP measurements are not useful for most CPP-GMR devices, and therefore, this is not a good solution to the problem.

Therefore, it is an objective of certain embodiments of the present invention to provide a method to test the quality of a CPP-GMR multilayer wafer without fabricating complicated devices on the wafer.

It is another objective of certain embodiments of the present invention to provide a method to test an unpatterned CPP-GMR multilayer wafer multilayer directly and quickly without employing a complicated patterning process on the unpatterned wafer.

SUMMARY OF THE INVENTION

In a first aspect, the present invention relates to a device prepared for testing the current perpendicular to the plane resistance of the device including: a substrate, a conductive base layer on the substrate, and a magnetic multilayer containing a magnetic material on the conductive base layer. The magnetic multilayer includes at least one ring-shaped first continuous portion of the magnetic multilayer surrounding a hole in the magnetic multilayer, and a second portion of the magnetic multilayer separated from the first continuous portion by a trench surrounding the first continuous portion of the magnetic multilayer.

In a second aspect, the present invention relates to a method for testing the properties of a device including a substrate, a conductive base layer on the substrate and a magnetic multilayer containing a magnetic material on the conductive base layer. The method includes the steps of: forming at least one hole in the magnetic multilayer and an isolation trench around the at least one hole to isolate at least one first continuous portion of the magnetic multilayer around the at least one hole from a second portion of the magnetic multilayer, and determining a property of the device by contacting a probe with the at least one first continuous portion of the magnetic multilayer, applying a predetermined current or voltage to the probe and measuring a current or voltage at the conductive base layer.

For a better understanding of the present invention, together with other and further objectives thereof, reference is made to the following description, taken in conjunction with the accompanying drawings.

DETAILED DESCRIPTION OF THE PREFERRED EMBODIMENTS

Figure 1:
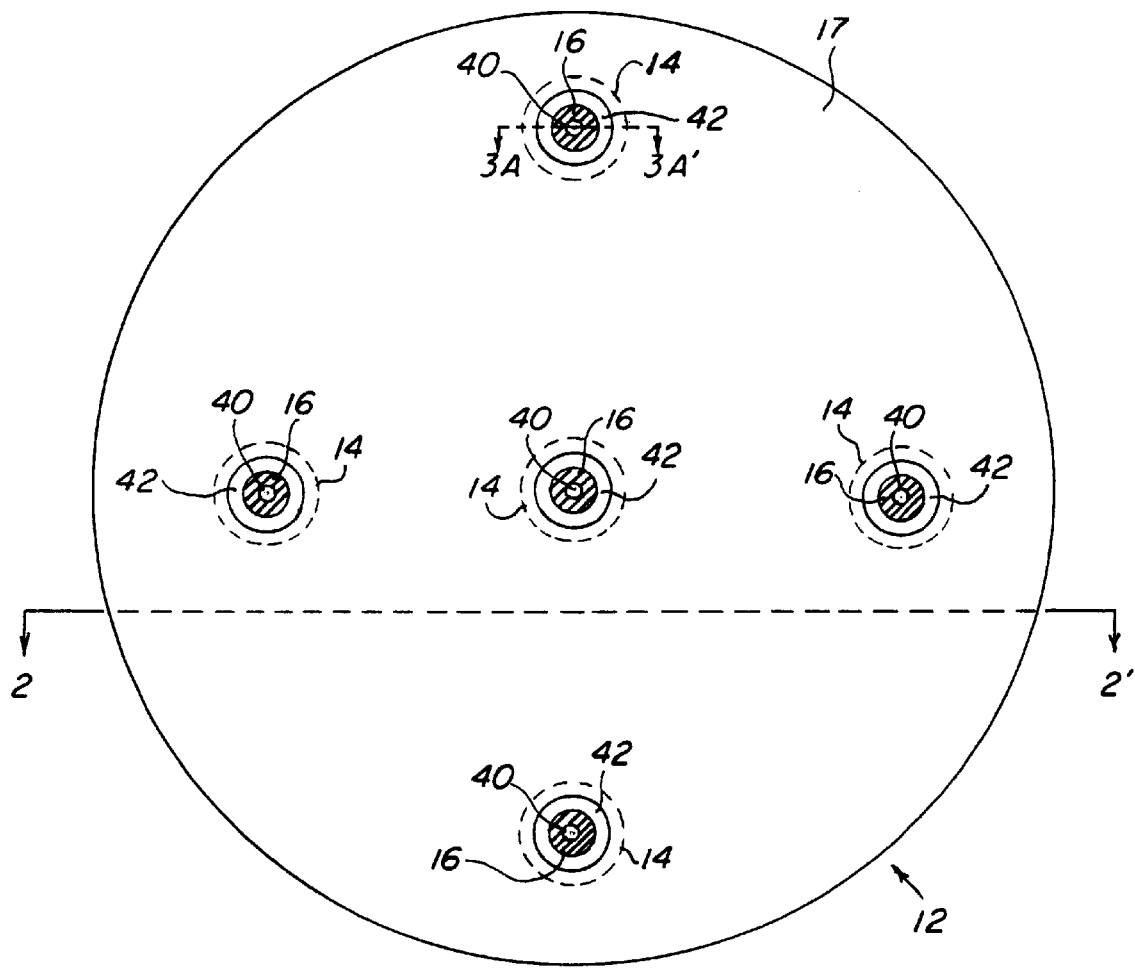
FIG. 1 is a top view of a wafer prepared for testing current perpendicular to the plane properties of the multilayer device in accordance with the present invention.

In a first aspect, the present invention relates to a multilayer device prepared for testing the current perpendicular to the plane resistance of the device. Preferably, the device of the present invention is a multilayered wafer 12 as illustrated in FIG. 1 of the drawings. In FIG. 1, wafer 12 contains at least one testing area 14. Each testing area 14 has a first continuous portion or testing ring 16 formed in the magnetic multilayer 27 (shown in FIG. 2) of wafer 12. Each testing ring 16 is surrounded by a trench 42, which may be etched into and through the magnetic multilayer 27 (shown in FIG. 2). Trench 42 separates testing ring 16 from the second portion 17 of the magnetic multilayer 27. Each testing ring 16 also surrounds a hole 40 which may be etched into and through the magnetic multilayer 27 (shown in FIG. 2).

The wafer 12 preferably has more than one testing area 14. More preferably, the wafer 12 has several testing areas 14 at various locations on the wafer 12 to permit sampling of different locations in the magnetic multilayer 27 to determine one or more properties of the magnetic multilayer 27 at each testing area 14. Most preferably, each wafer 12 has at least five testing areas 14.

Figure 2:
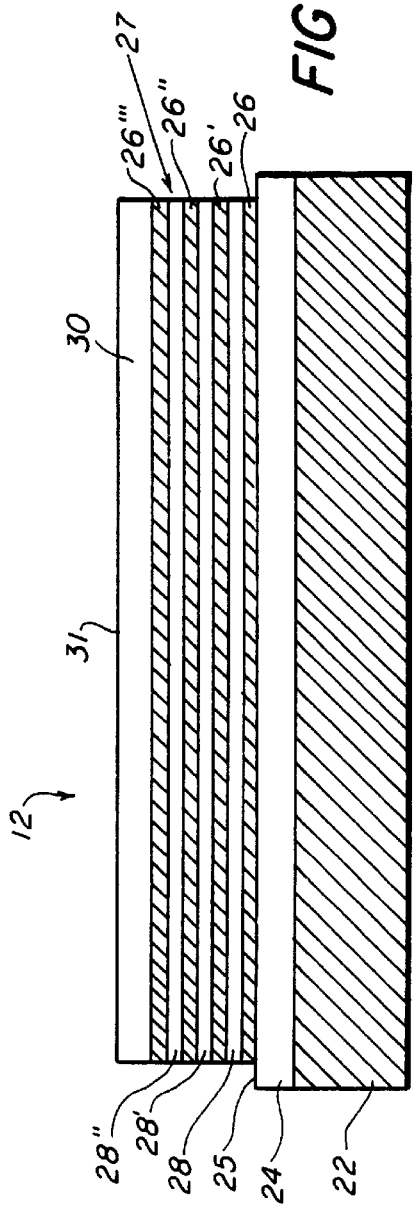
FIG. 2 is a cross-sectional view of the wafer along line 2–2' of FIG. 1.

Now referring to FIG. 2, which is a cross-sectional view of the multilayered wafer 12 along line 2–2' of FIG. 1, the wafer 12 contains a semiconductor substrate 22. On top of semiconductor substrate 22 there is a conductive base layer 24, which is made of a conductive material. The conductive base layer 24 is in close contact with semiconductor substrate 22, but may be insulated from it by an optional insulating layer. On top of the conductive base layer 24, there is a magnetic multilayer 27, which includes a magnetic material. The preferred magnetic material used in magnetic multilayer 27, is selected from the group consisting of iron, nickel, cobalt, alloys thereof, oxides thereof and mixtures thereof, separated by non-magnetic metallic layers.

In a more preferred embodiment, wafer 12 may further include a conductive top layer 30 on top of the magnetic multilayer 27.

The magnetic multilayer 27 contains at least two magnetic layers 26 and 26' separated by a nonmagnetic layer 28. More preferably, the magnetic multilayer 27 contains a plurality of magnetic layers 26, 26', 26" and 26'" and a plurality of nonmagnetic layers 28, 28' and 28". Each nonmagnetic layer 28, 28' or 28" is sandwiched by two adjacent magnetic layers 26, 26', 26" or 26'".

The semiconductor substrate 22, optional insulating layer, conductive base layer 24, magnetic multilayer 27 including magnetic layers 26, 26', 26" and 26'" and nonmagnetic single layers 28, 28' and 28", and conductive top layer 30 are all electrically connected to their vertically adjacent layers. All of these layers are electrically conductive in the direction perpendicular to the plane of the wafer 12.

Preferably, conductive base layer 24 is fabricated by depositing a conductive material on a substrate 22 using conventional manufacturing technology such as by physical vapor deposition, chemical vapor deposition, RF sputtering, solution deposition, and other suitable processes. Following the deposition of conductive base layer 24, a magnetic layer 26 can be deposited on top of conductive base layer 24 followed by deposition of a nonmagnetic layer 28 using a similar deposition process. This deposition procedure is repeated as necessary to deposit multiple nonmagnetic layers 28, 28', 28" and multiple magnetic layers 26, 26', 26" and 26'" so that each nonmagnetic layer 28, 28' or 28" is sandwiched between two adjacent magnetic layers 26, 26', 26", or 26'" to form the magnetic multilayer 27. Finally, a conductive top layer 30 can be deposited on top of the magnetic multilayer to complete the deposition process.

U.S. Pat. No. 6,171,693 to Lubitz et al, which is incorporated by reference herein, discloses several methods of depositing conductive base layer 24, magnetic layers 26, 26', 26" and 26'", nonmagnetic layers 28, 28' and 28", and conductive top layer 30.

Preferably, the substrate 22 is a semiconductor substrate. More preferably, the substrate 22 is selected from the group consisting of a single crystal silicon substrate, a GaAs single crystal substrate, a single crystal silicon substrate doped with other elements, a GaAs single crystal substrate doped with other elements, or any other suitable substrate known to a person skilled in the art.

Preferably, the optional insulating layer is made from silicon nitride, silicon oxide, or any other suitable insulator. Proper use of the optional insulating layer is known to a person skilled in the art.

Preferably, the conductive base layer 24 and conductive top layer 30 are made from a good conductor such as copper, silver, platinum, gold, alloys thereof, and mixtures thereof. More preferably, top surface 31 of top layer 30 may be coated with a conductive oxidation-resistant metal. such as gold or platinum.

Preferably, the nonmagnetic layers 28, 28', 28" may be made from a metal such as copper, silver, gold, platinum, chromium, alloys thereof, and mixtures thereof. Alternatively, the nonmagnetic layers 28, 28', 28" may be made from an insulating material, which can still conduct an electrical current at a suitable thickness due to a tunnel effect. Preferably, the magnetic layers 26, 26', 26" and 26'" are made from a 0 ferromagnetic material such as iron, nickel, cobalt, alloys thereof, oxides thereof and mixtures thereof.

The thickness of each of the above-mentioned layers 22, 24, 27 and 30 in this multilayered wafer 12 is conventional and are known to a person skilled in the art. The thickness of substrate 22 can be varied significantly, depending on its desired function. For example, the substrate 22 may be a silicon semiconductor substrate that itself contains many devices to perform designed functions after the wafer 12 is completed or patterned into one or more semiconductor chips. Methods for incorporating logic or memory devices into a silicon semiconductor substrate are well known to a person skilled in the art.

Preferably, conductive base layer 24 has a thickness of less than 1000 Å. Conductive base layer 24 generally serves as a separation layer between the magnetic multilayer 27 and the substrate 22 or between the magnetic multilayer 27 and the optional insulating layer. Preferably, magnetic multilayer 27 has a thickness of less than about 3000 Å. More preferably, magnetic multilayer 27 has a thickness of less than about 1500 Å.

Preferably, each of the magnetic layers 26, 26', 26" and 26'" has a thickness between about 10 Å and about 100 Å. More preferably, the thickness of each of the magnetic layers 26, 26', 26", and 26'" is between about 20 Å and about 60 Å.

A suitable thickness for each of the nonmagnetic layers 28, 28' and 28" may be chosen depending on the fabrication technique used, the desired alignment efficiency in the magnetic layer 26, 26', 26" and 26" in response to an external electric field, the material of construction used in the nonmagnetic layers 28, 28' and 28" and the dimensional requirement of the final patterned multilayered devices produced therefrom. A skilled person in the art knows how to choose the thickness according to the desired result to be achieved.

Preferably, the thickness of each of the nonmagnetic layers 28, 28' and 28" is between about 5 Å and about 100 Å, when the nonmagnetic layers 28, 28' and 28" are fabricated from a good conductor such as copper, silver, gold, platinum, alloys thereof, and mixtures thereof.

When the nonmagnetic layers 28, 28' and 28" are fabricated from an insulating material, such as aluminum oxide, aluminum nitride, silicon oxide or silicon nitride, the thickness of each of the nonmagnetic layer 28, 28' and 28" is, preferably, less than about 20 Å to achieve a meaningful tunneling effect for electrons. In this case, the magnetic multilayer may be called magnetic tunnel junction. U.S. Pat. No. 6,111,784 to Nishimura, is incorporated by reference herein for the purpose of disclosing a device using nonmagnetic layers, which provide a tunneling effect.

Similarly, the conductive top layer 30 may have a predetermined thickness depending on the final function of the wafer 12. The predetermined thickness of a suitable conductive top layer 30 is well known to a person skilled in the art.

The wafer 12 of the present invention may have variable diameters. For example, this wafer 12 may have a diameter of 6", 12", 14" or 18". In addition wafer 12 does not have to have a round shape. Wafer 12 may have other shapes such as rectangular, triangular, oval or other suitable shapes.

In a preferred embodiment of the present invention, both the conductive base layer 24 and the substrate 22 have slightly larger diameters than all the other layers including the magnetic multilayer 27, and the conductive top layer 30, so that the outer edge of the conductive base layer 24 is revealed as a conductive ring 25.

Figure 3A:
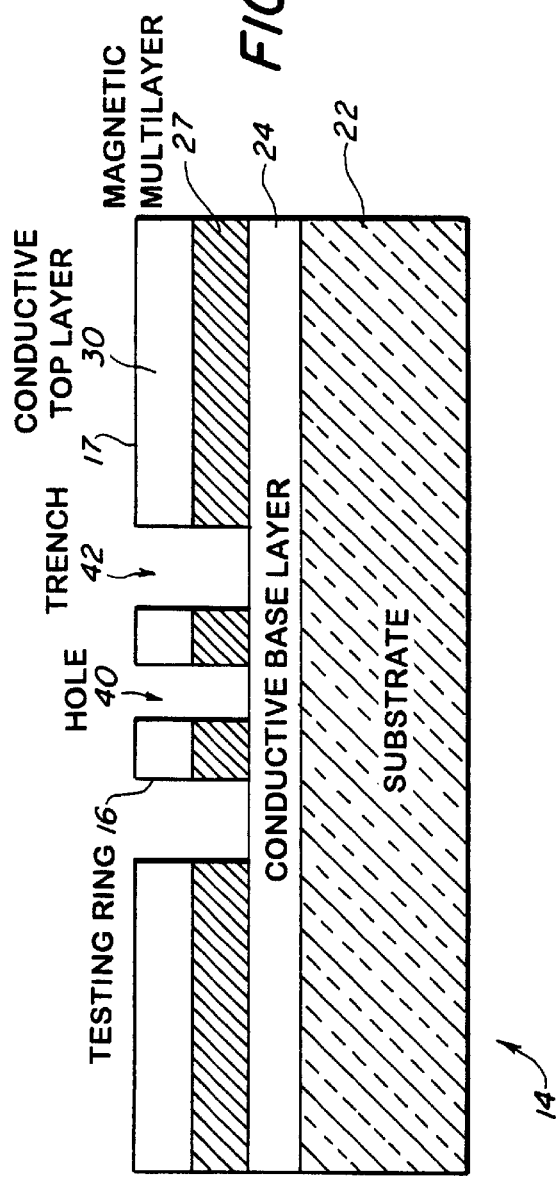
FIG. 3A is a cross-sectional view of a testing area of the multilayer device shown in FIG. 1 along the line 3A–3A'.

Now referring to FIG. 3A, a cross-sectional view of one of the testing areas 14 along the line 3A–3A' of FIG. 1 is illustrated. FIG. 3A illustrates a testing area 14 of the wafer 12 including a testing ring 16. In the testing area 14, the wafer 12 includes the same layers as the rest of the wafer 12. To form testing ring 16, a trench 42 is formed in the magnetic multilayer 27 and conductive top layer 30 to surround the testing ring 16. To complete the testing ring 16, a hole 40 is formed within the testing ring 16 through the magnetic multilayer 27 and conductive top layer 30, as shown. Hole 40 and trench 42 may be formed by an etching process. Trench 42 separates testing ring 16 from the second portion 17 of the conductive top layer 30 and the magnetic multilayer 27. Preferably, the conductive base layer 24 and substrate 22 are left intact, as well as the optional insulating layer, when hole 40 and trench 42 are formed.

Figure 3B:
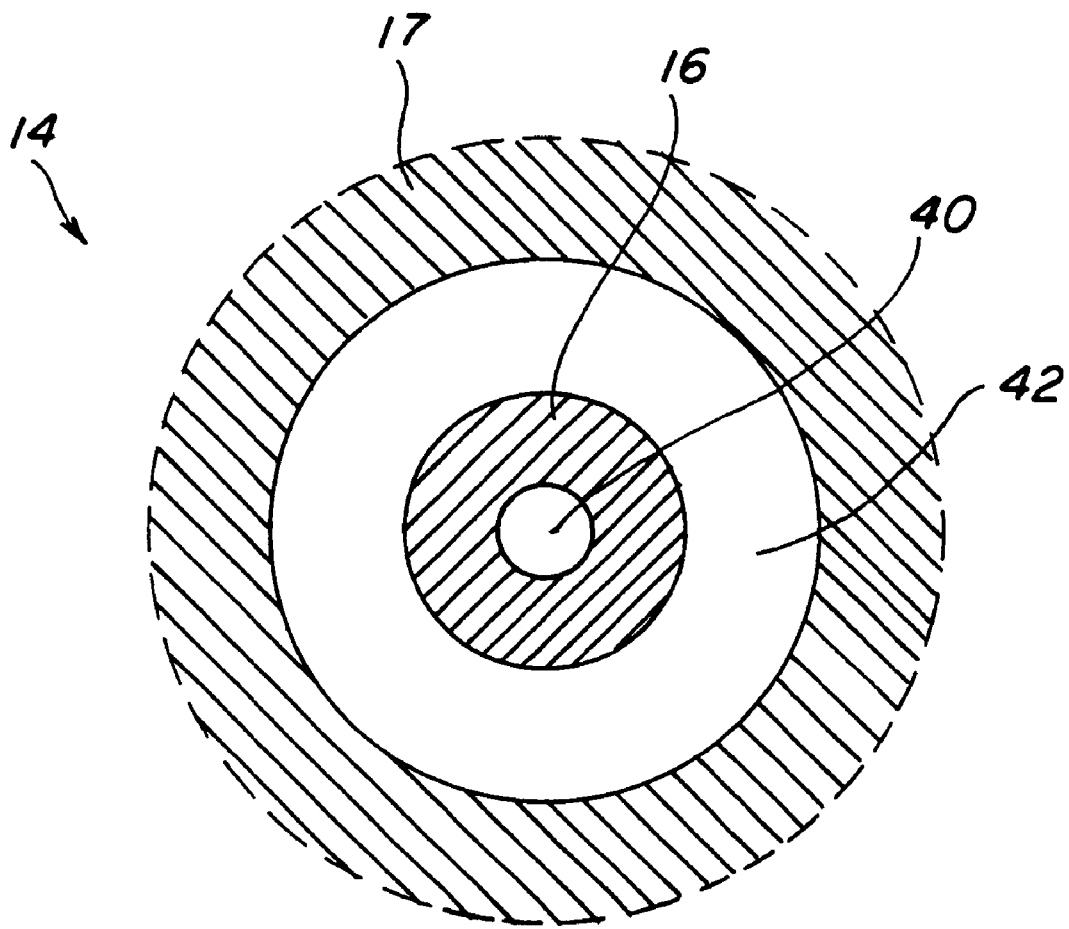
FIG. 3B is a top view of a testing area of the multilayer device shown in FIG. 3A.

FIG. 3B illustrates a top view of the testing area 14 shown in FIG. 3A. In this embodiment the testing ring 16 is a round ring with a hole 40 and a trench 42 around it. However neither hole 40, nor trench 42 has to be round. They could each have other shapes such as rectangular, triangular, etc. The only requirement is that the trench 42 isolates testing ring 16 from the second portion 17 of the magnetic multilayer 27, and the conductive top layer 30. The testing ring 16 does not have to be round, either. The testing ring 16 could be rectangular, triangular, etc. as long as it forms a closed loop as shown in FIG. 3B. The closed loop of testing ring 16 allows the magnetic field to form when the testing ring 16 is subject to an electric field perpendicular to the plane of wafer 12.

The hole 40 located within the testing ring 16 may be needed for preventing a magnetic pattern discontinuity or singularity in the testing area 14 when the wafer 12 is subjected to a resistance measurement. The magnetic pattern discontinuity or singularity may render such resistance measurements inaccurate.

The etching process to form the hole 40 and trench 42 is well known to persons skilled in the art. This may be accomplished by, for example, a photolithographic etching process, a focused ion beam etching process, or other suitable processes. Preferably, the etching process used in the present invention is a focused ion beam etching process, which is a dry etching process. The focused ion beam etching process may be carried out on a focused ion beam workstation, which is a commercially available instrument and commonly used to repair expensive, customized semiconductor chips. This etching process may be repeated at various testing areas 14 on the wafer 12 so that enough areas are etched to represent the entire wafer 12. Preferably, more than 5 testing areas 14 on the wafer 12 are etched using this process. The location of testing areas 14 may be varied depending on the desired testing requirements.

Preferably, the size of the hole 40, testing ring 16 and trench 42 are small in comparison with the size of the wafer 12. More preferably, the diameter of the hole 40 is less than 1 $\mu$m, the diameter of the testing ring 16 including hole 40 is less than 3 $\mu$m and the diameter of the trench 42, hole 40 and testing ring 16, taken together, is less than 10 $\mu$m. Most preferably, the diameter of the hole 40 is less than 0.2 $\mu$m, the diameter of the testing ring 16 including hole 40 is less than 0.6 $\mu$m and the diameter of the trench 42, hole 40 and testing ring 16, taken together, is less than 2 $\mu$m. In general, smaller sizes of the hole 40, testing ring 16 and trench 42 tend to give a higher measurable CPP resistance and, thus, improve the accuracy of the CPP resistance measurement. Another advantage of minimizing the dimensions of the hole 40, testing ring 16 and trench 42 is that the total testing areas 14 are minimal in comparison with the total area of the wafer 12. Therefore, the wafer 12 may still be useful for further fabrication steps to obtain functional GMR devices. Only the isolated testing areas 14 are no longer useful. Since this represents only a very small portion of the wafer's total area, the lost device area is inconsequential.

In a second aspect, the present invention relates to a method for testing the properties of a CPP-GM multilayer device including a substrate, an optional insulating layer, a conductive base layer on the substrate and a magnetic multilayer containing a magnetic material on the conductive base layer. The method includes the steps of: forming at least one hole in the magnetic multilayer on the wafer and an isolation trench around the at least one hole to isolate at least one first continuous portion of the magnetic multilayer around the at least one hole from a second portion of the magnetic multilayer, and determining a property of the CPP-GMR multilayer device by contacting a probe with the at least one first continuous portion of the magnetic multilayer, applying a current to the probe and measuring at least one property of the multilayer device.

Figure 4:
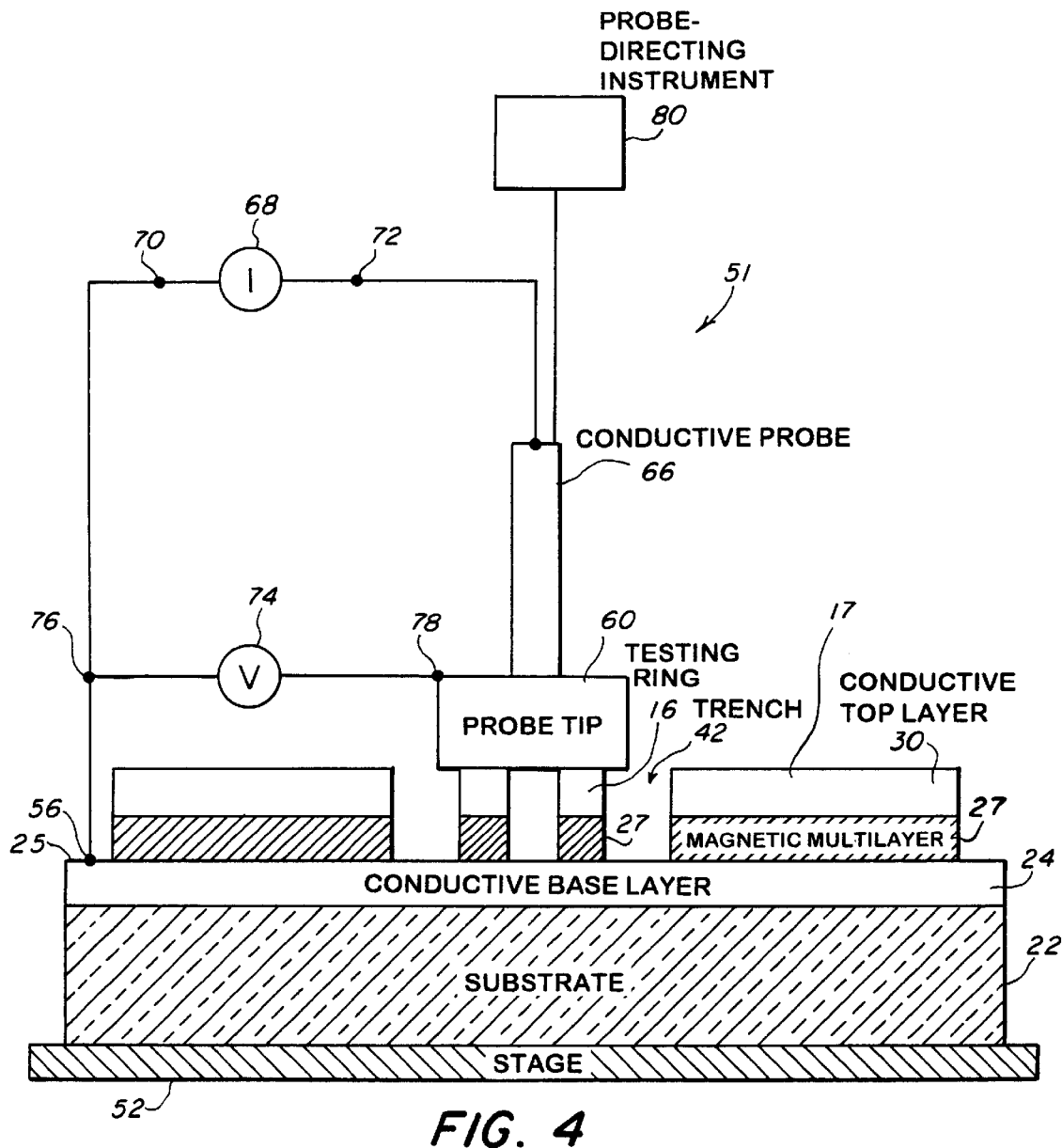
FIG. 4 is diagram of an apparatus suitable for testing current perpendicular to the plane properties of a multilayer device according to the present invention.

Now referring to FIG. 4 of the drawings, FIG. 4 illustrates a testing apparatus 51 together with a wafer 12, which may be a CPP-GMR multilayer device, of the present invention. The apparatus 51 includes a stage 52 for holding wafer 12, a conductive probe 66, which can carry a voltage and a current at the same time, a connector 56, which can be electrically connected to conductive base layer 24 preferably at conductive ring 25 of the wafer 12, a voltage measuring device 74 and a current source 68 for supplying a predetermined current to probe 66.

During testing, a wafer 12 is fixed on stage 52. Connector 56 is connected to conductive base layer 24 preferably at conductive ring 25 of wafer 12. Preferably, probe 66 may include a probe tip 60, which is positioned to be in electrical contact with the magnetic multilayer 27 of testing ring 16 either directly or via conductive top layer 30. Trench 42 ensures that probe tip 60 is not in electrical contact with second portion 17 of the conductive top layer 30 and magnetic multilayer 27. A predetermined current supplied by current source 68 can pass through the probe tip 60 into testing ring 16, which is in electrical contact with the conductive base layer 24. The predetermined current passes through testing ring 16, further through the conductive base layer 24 to connector 56. In this testing apparatus 51, current source 68 may, preferably, also be a current measuring device that has two connectors 70 and 72. Connector 72 is electrically connected to the probe 66. Connector 70 is electrically connected to connector 56. More preferably, current source 68 may be a variable current source, which can vary the current applied to the probe 66.

The voltage-measuring device 64 is, preferably, a voltmeter having connectors 76 and 78. Connector 76 is electrically connected to connector 56. Connector 78 is electrically connected to probe tip 60 or to probe 66. The current source 68 generates a current. The current flows through the magnetic multilayers 27 in the test ring 16 in a direction substantially perpendicular to the plane of the wafer 12. The current reaches the conductive base layer 24 and returns to the current source 68 through connector 56. During this process, the voltage between the probe tip 60 and the conductive base layer 24 is measured. Since, both the conductive top layer 30 and conductive base layer 24 are good conductors, the resistance contributions from both layers are constant and relatively small and thus may be subtracted, if known, or ignored as negligible. Based on the measured voltage and the predetermined or measured current, the electrical resistance perpendicular to the plane of the wafer 12 or multilayer 27 can be determined.

The current applied to the testing ring 16 may be varied depending on many factors, such as the type of wafer 12 being tested, the size of the testing ring 16 and the number of the magnetic layers 26, 26', 26" and 26''' in the wafer 12. Preferably, the current applied to the testing ring 16 is between 1 mAmp and 1 Amp. More preferably, the current applied to the testing ring 16 is between 50 mAmp and 200 mAmp.

Alternatively, the current source 68 may supply a predetermined voltage. The current flowing through probe 66 may be measured by current source 68, which may also be a current measuring device. In this case, voltage-measuring device 74 may not be needed to determine the resistance of magnetic multilayer 27. Based on the predetermined voltage and measured current, the electrical resistance perpendicular to the plane of the wafer 12 or multilayer 27 can be determined.

In addition to the perpendicular to plane resistance information at a single predetermined current, the perpendicular to plane resistance of the wafer 12 can be obtained at various applied current levels. For example, the current source 68 may supply a different predetermined current at a different time and the voltmeter 74 may obtain a different electrical resistance reading (directly or indirectly) at each different applied current. Based on the relationship between the electrical resistance vs. applied current, a profile of the properties of the wafer 12 can be obtained. The magnetic field directions in the magnetic multilayer at a particular applied current may also be determined.

Preferably, the apparatus 51 for testing a multilayered wafer 12 of the present invention further comprises a probe-directing instrument 80. The probe-directing instrument 80 can position the probe precisely on the wafer 12. Preferably, the probe-directing instrument 80 may be selected from the group consisting of an atomic force microscope (AFM) and a scanning tunneling microscope (STM), which are commercially available. In order to use AFM or STM instrument as the probe directing instrument 80 it may be adapted to carry the desired current and to measure the desired voltage. This type of adaptation is well known to a person skilled in the art. Preferably, the procedure for positioning the probe 66 on the wafer 12 may be done electrically by monitoring a signal as the probe 66 is drawn across the surface of wafer 12, or mechanically by shaping the probe 66 to have a sharp end tip to permit it to be operated as an atomic force microscope tip probe.

There are many advantages of this invention. First of all, the method of the present invention does not require expensive and time consuming lithographic processing of a complete wafer in order to determine the quality and performance of a GMR multilayer wafer before being used in manufacturing CPP devices. Second, this method of the present invention also enables a determination of subsequent processing steps have any effect upon the GMR behaviors by comparing the measurement results of unpatterned wafer 12 with the measurement results of the devices made from wafer 12 after its being processed or patterned. Thirdly, the method of the present invention permits the measurement to be carried out at room temperature. Fourth, measurements can be carried out without destroying an appreciable amount of the multilayered wafer, thus leaving a useful wafer once measurements are completed.

While there have been described what are believed to be the preferred embodiments of the present invention, those skilled in the art will recognize that other and further changes and modifications may be made thereto without departing from the spirit of the invention, and it is intended to claim all such changes and modifications as fall within the true scope of the invention.

We claim:

1. A method for determining a property of current perpendicular to the plane of a device including a substrate, a conductive base layer on the substrate and a magnetic multilayer containing a magnetic material on the conductive base layer comprising the steps of:

forming at least one hole in the magnetic multilayer of the device and a trench around each said hole to isolate at least one first continuous portion of the magnetic multilayer around the at least one hole from a second portion of the magnetic multilayer wherein the diameter of the trench, hole and testing ring, taken together, is less than 10 micrometer; and determining the property of the device by electrically contacting a probe with the at least one first continuous portion of the magnetic multilayer, applying a predetermined current or voltage to the probe, and measuring a property of the device.

2. The method as claimed in claim 1,
   wherein the magnetic multilayer comprises a plurality of magnetic layers each containing a magnetic material, and a plurality of nonmagnetic layers, and
   wherein each of the plurality of nonmagnetic layers is sandwiched between two adjacent magnetic layers.

3. The method as claimed in claim 1,
   wherein the device further comprises a conductive top layer on top of the magnetic multilayer,
   wherein the step of forming the at least one hole and each said trench further comprises the step of forming a hole and a trench in the conductive top layer to form a first continuous portion of the conductive top layer between each said hole and each said trench, and wherein the probe is electrically contacted with the first continuous portion of the magnetic multilayer via the first continuous portion of the conductive top layer.

4. The method as claimed in claim 1, wherein the step of forming the at least one hole and each said trench is carried out using a dry etching process.

5. The method as claimed in claim 1, wherein the step of forming the hole and the trench forms at least five holes and at least five trenches around each of the at least five holes to provide at least five first continuous portions of the magnetic multi layer.

6. The method as claimed in claim 1, wherein the step of determining the property of the device further comprises the steps of:

electrically connecting a connector to the conductive base layer;

measuring a voltage between the probe and the connector; and determining an electrical resistance of the magnetic multilayer based on the predetermined current and measured voltage.

7. The method as claimed in claim 6, wherein the step of determining the property of the device further comprises the steps of:

varying the predetermined current or voltage to apply multiple different predetermined currents or voltages to the probe; and obtaining the electrical resistance at each of the different predetermined currents or voltages.

8. The method as claimed in claim 1, wherein the diameter of the hole is less than 1 micrometer, and the diameter of the testing ring including hole is less than 3 micrometer.

9. A device comprising:

a substrate;

a conductive base layer on the substrate; and a magnetic multilayer comprising a magnetic material on the conductive base layer, wherein the magnetic multilayer comprises at least one ring-shaped, first continuous portion of the magnetic multilayer which surrounds a hole in the magnetic multilayer, and a second portion of the magnetic multilayer separated from said first continuous portion by a trench surrounding the first continuous portion of the magnetic multilayer wherein the diameter of the trench, hole and testing ring, taken together, is less than 10 micrometer.

10. The device as claimed in claim 9, wherein the magnetic multilayer comprises a plurality of magnetic layers each comprising magnetic material and a plurality of nonmagnetic layers, and wherein each of the plurality of nonmagnetic layers is sandwiched between two adjacent magnetic layers.

11. The device as claimed in claim 10, wherein each nonmagnetic layer comprises a material selected from copper, silver, gold, platinum, chromium, alloys thereof, and mixtures thereof.

12. The device as claimed in claim 10, wherein the nonmagnetic layer comprises an insulating material.

13. The device as claimed in claim 10, wherein each magnetic layer comprises a material selected from iron, nickel, cobalt, alloys thereof, oxides thereof, and mixtures thereof.

14. The device as claimed in claim 10, wherein the diameter of the hole is less than 1 micrometer, and the diameter of the testing ring including hole is less than 3 micrometer.

15. The device as claimed in claim 9 further comprising a conductive top layer on top of the magnetic multilayer, and wherein the conductive top layer comprises at least one first continuous portion and a second portion;

wherein the first and second portions of the conductive top layer each have the same shape, as viewed in a horizontal plane, as the first and second portions of the magnetic multilayer underneath the conductive top layer, respectively.

16. A method for determining an electrical resistance of a device as claimed in claim 15 comprising the steps of:

electrically contacting a probe with the first continuous portion of the conductive top layer;

applying a predetermined current to the probe; and determining the electrical resistance of the device by measuring a voltage or a current at the conductive base layer.

17. A method for determining an electrical resistance of the device as claimed in claim 9 comprising the steps of:

electrically contacting a probe with the first continuous portion of the magnetic multilayer;

applying a predetermined current to the probe; and determining the electrical resistance of the device by measuring a voltage or a current at the conductive base layer.

18. A method for determining a property of current perpendicular to the plane of a device including a substrate, a conductive base layer on the substrate and a magnetic multilayer containing a magnetic material on the conductive base layer comprising the steps of:

forming at least one hole in the magnetic multilayer of the device and a trench around the at least one hole to isolate at least one first continuous portion of the magnetic multilayer around the at least one hole from a second portion of the magnetic multilayer wherein the diameter of the trench, hole and testing ring, taken together, is less than 10 micrometer; and determining the property of the device by electrically contacting a probe with the at least one first continuous portion of the magnetic multilayer, applying a predetermined voltage to the probe; and measuring a voltage or a current at the conductive base layer.

19. The method as claimed in claim 18, wherein the step of determining the property of the device further comprising the step of:

obtaining an electrical resistance of the magnetic multilayer based on the measured current and predetermined voltage.

20. The method as claimed in claim 18, wherein the diameter of the hole is less than 1 micrometer, and the diameter of the testing ring including hole is less than 3 micrometer.

* * * * *